United States Patent
Bangsaruntip et al.

(10) Patent No.: US 8,564,025 B2
(45) Date of Patent: *Oct. 22, 2013

(54) NANOWIRE FET HAVING INDUCED RADIAL STRAIN

(75) Inventors: Sarunya Bangsaruntip, Yorktown Heights, NY (US); Guy Cohen, Yorktown Heights, NY (US); Conal E. Murray, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/566,594

(22) Filed: Aug. 3, 2012

(65) Prior Publication Data

US 2012/0298948 A1 Nov. 29, 2012

Related U.S. Application Data

(62) Division of application No. 12/631,203, filed on Dec. 4, 2009.

(51) Int. Cl.
*H01L 29/76* (2006.01)
*H01L 21/336* (2006.01)

(52) U.S. Cl.
USPC ......... 257/213; 257/9; 257/12; 257/208; 257/368; 257/E21.409; 257/E21.431; 257/E21.432; 257/E29.267; 438/151; 438/157; 438/248; 438/479; 438/763

(58) Field of Classification Search
USPC .......... 257/9, 12, 208, 213, 368, E21.409, 257/E21.431, E21.432, E29.267; 438/151, 438/157, 248, 479, 763

See application file for complete search history.

(56) References Cited

U.S. PATENT DOCUMENTS

| | | | |
|---|---|---|---|
| 7,145,246 B2 | 12/2006 | Hareland et al. | |
| 7,416,949 B1 | 8/2008 | Pas et al. | |
| 7,534,675 B2 | 5/2009 | Bangsaruntip et al. | |
| 7,538,339 B2 | 5/2009 | Greene et al. | |
| 7,755,144 B2 | 7/2010 | Li et al. | |
| 7,829,916 B2 | 11/2010 | Morand et al. | |
| 2006/0022197 A1 | 2/2006 | Wirbeleit et al. | |
| 2006/0091428 A1* | 5/2006 | Yeo et al. | 257/213 |
| 2007/0099360 A1 | 5/2007 | Lee et al. | |

(Continued)

FOREIGN PATENT DOCUMENTS

| | | |
|---|---|---|
| EP | 1804286 A1 | 7/2007 |
| WO | 2006/135336 A1 | 12/2006 |

OTHER PUBLICATIONS

Seike, A. et al., "Strain-induced transconductance enhancement by pattern dependent oxidation in silicon nanowire field-effect transistors", Applied Physics Letters 91, 202117, 2007.

(Continued)

*Primary Examiner* — Dao H Nguyen
(74) *Attorney, Agent, or Firm* — Cantor Colburn LLP; Vazken Alexanian

(57) ABSTRACT

An intermediate process device is provided and includes a nanowire connecting first and second silicon-on-insulator (SOI) pads, a gate including a gate conductor surrounding the nanowire and poly-Si surrounding the gate conductor and silicide forming metal disposed to react with the poly-Si to form a fully silicided (FUSI) material to induce radial strain in the nanowire.

20 Claims, 6 Drawing Sheets

(56) References Cited

U.S. PATENT DOCUMENTS

| | | |
|---|---|---|
| 2008/0067495 A1 | 3/2008 | Verhulst |
| 2008/0305621 A1 | 12/2008 | Dyer et al. |
| 2009/0104746 A1 | 4/2009 | Clifton et al. |
| 2009/0174003 A1 | 7/2009 | Chang et al. |
| 2009/0242986 A1 | 10/2009 | Nakabayashi et al. |
| 2010/0167492 A1 | 7/2010 | Iwamatsu |
| 2011/0012090 A1 | 1/2011 | Singh et al. |
| 2011/0020987 A1 | 1/2011 | Hareland et al. |
| 2011/0027919 A1 | 2/2011 | Wack et al. |
| 2011/0049639 A1* | 3/2011 | Doornbos et al. ............ 257/368 |

OTHER PUBLICATIONS

Co-Pending Patent Application, "Nanowire FET Having Induced Radial Strain", filed Dec. 4, 2009.

Office Action dated May 2, 2011 for corresponding U.S. Appl. No. 12/631,203, filed Dec. 4, 2009; 15 pages.

Office Action dated Dec. 8, 2011 for corresponding U.S. Appl. No. 12/631,203, filed Dec. 4, 2009; 14 pages.

Office Action dated Mar. 1, 2012 for corresponding U.S. Appl. No. 12/631,203, filed Dec. 4, 2009; 11 pages.

\* cited by examiner

NANOWIRE FET HAVING INDUCED RADIAL STRAIN

CROSS-REFERENCE TO RELATED APPLICATION

This application is a divisional of and claims the benefit of priority to U.S. application Ser. No. 12/631,203, now allowed, which was filed on Dec. 4, 2009. The entire contents of U.S. application Ser. No. 12/631,203 are incorporated herein by reference.

BACKGROUND

Aspects of the present invention are directed to a nanowire field effect transistor (FET) and, more particularly, to a nanowire FET with a metal gate that is surrounded with silicide around the metal gate for inducing radial and, in some cases, longitudinal strain in the nanowire channel.

In a field effect transistor (FET) with nanowire channels, it is possible to induce longitudinal strain in the nanowires since the relatively small diameters of the nanowires leads to efficient strain coupling from a stressor. While longitudinal strain was studied in detail in planar devices and more recently longitudinal tensile strain was demonstrated with nanowire FETs, the effect of radial strain on the carrier transport in nanowires is unknown.

One of the main challenges with studying the impact of radial strain in a nanowire FET is that the gate material needs to be varied to change the strain level. Altering the gate conductor changes the induced strain but also other properties of the device such as the work function. Additionally, the use of different gate materials requires substantial processing development.

SUMMARY

In accordance with an aspect of the invention, an intermediate process device is provided and includes a nanowire connecting first and second silicon-on-insulator (SOI) pads, a gate including a gate conductor surrounding the nanowire and poly-Si surrounding the gate conductor and silicide forming metal disposed to react with the poly-Si to form a fully silicided (FUSI) material to induce radial strain on the nanowire.

In accordance with an aspect of the invention, an intermediate process device is provided and includes first and second pads, a nanowire, formed in a silicon-on-insulator (SOI) layer disposed over a buried oxide (BOX) layer, connecting the first and second pads, a gate surrounding the nanowire and including a dielectric adjacent the nanowire, a gate conductor adjacent the dielectric and poly-Si surrounding the gate conductor and silicide forming metal disposed at least along sidewalls of the poly-Si to react with the poly-Si to form a fully silicided (FUSI) material to induce radial strain in the nanowire.

In accordance with an aspect of the invention, a method to induce radial strain in a field effect transistor (FET) nanowire is provided and includes surrounding the nanowire with a gate conductor and surrounding the gate conductor with poly-Si, and reacting the poly-Si with silicide forming metal deposited thereon to form a fully silicided (FUSI) material to induce radial strain in the nanowire prior to fabrication of source and drain regions relative to the nanowire.

In accordance with another aspect of the invention, a method to induce radial strain in a field effect transistor (FET) nanowire is provided and includes surrounding the nanowire with a gate conductor and surrounding the gate conductor with poly-Si, reacting the poly-Si with silicide forming metal deposited thereon to form a fully silicided (FUSI) material to induce radial strain in the nanowire, forming spacers on opposing sides of the FUSI material, and fabricating source and drain regions relative to the nanowire subsequent to the reacting.

BRIEF DESCRIPTIONS OF THE SEVERAL VIEWS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION

The present techniques provide a gate-all-around (GAA) nanowire field effect transistor (FET) as well as methods for fabricating the same. In this discussion, reference will be made to various drawings that illustrate embodiments of the present teachings. Since the drawings of the embodiments of the present teachings are provided for illustrative purposes, the structures contained therein are not drawn to scale.

The present methods are described using silicon (Si) nanowires and Si processing. However, the present techniques can also be practiced with other semiconductor materials such as, for example, germanium (Ge) or III-V semiconductors. When non-Si-containing semiconductors are used, the processing steps of the present teachings are basically the same except that growth temperature and dopant species applied are adapted to the specific semiconductor used. Use of Si-containing semiconductor materials such as Si, silicon germanium (SiGe), Si/SiGe, silicon carbide (SiC) or silicon germanium carbide (SiGeC), for example, are preferred however. It is noted that a portion of the nanowires is used herein as the device channel or body.

Figure 1:
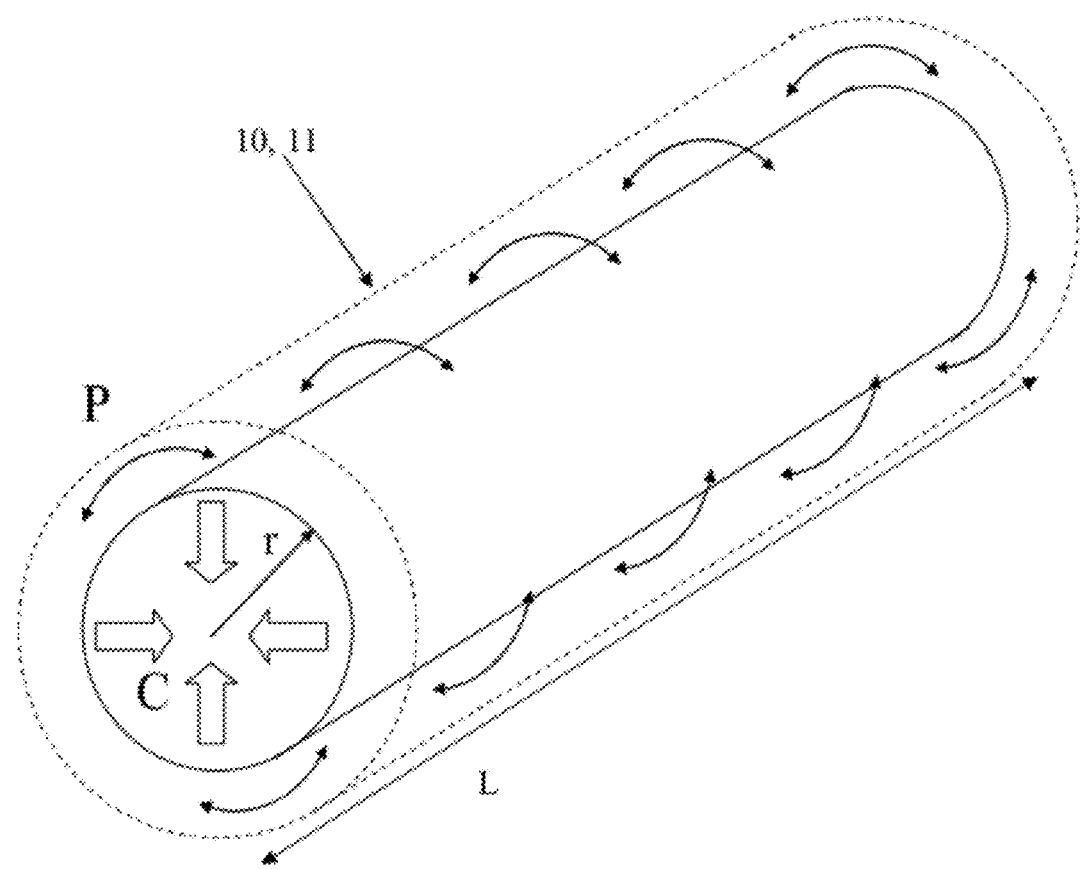
FIG. 1 is a perspective view of a nanowire under strain.

With reference to FIG. 1, in an FET with a nanowire channel 10, it is possible to relatively efficiently induce radial strain ($\Delta r/r$) as well as longitudinal strain ($\Delta L/L$), with r and L being the nanowire's radius and length, respectively, and $\Delta r$ and $\Delta L$ being the change in radius and the change in length, respectively, as a result of stress. The small diameter of the nanowire 11 leads to efficient strain coupling from a stressor with a residual stress, P, such as the material that would normally surround the nanowire 11 that generates a residual stress, C, in the nanowire. While longitudinal strain has been studied in detail in planar devices and, more recently, longitudinal tensile strain was demonstrated with nanowire FETs, the effect of radial strain on the carrier transport in nanowires is currently unknown due to the fact that, in studying the impact of radial strain in a nanowire FET, it has been necessary to vary the gate conductor material to change the strain level. While altering the gate conductor material changes the induced strain, the alteration requires substantial processing development and the varied gate conductor material changes other properties of the relevant device, such as the work function and threshold voltage.

In accordance with aspects of the present invention, a method to induce radial strain and, in some cases, longitudinal strain in a nanowire channel, without the need to change the gate conductor or the process that is used to define the gate is provided and makes use of a thin metal all-around-gate (e.g., about 2-4 nm and, in some cases, about 3 nm thick tantalum nitride (TaN)) while the "filler" material that connects all the nanowires' metal gates and forms a solid gate line is initially poly-Si that is later converted into fully silicided material (FUSI). The FUSI surrounding the metal gate effectively induces strain in the nanowire channel, but does not impact other device properties (such as the work function) since the latter is set by the metal gate. The gate definition process, therefore, remains substantially constant even if various silicides are used for the FUSI.

With reference to FIGS. 2-9, the device structure and process operations are summarized and relate to processes in which a FUSI gate may be formed at an elevated temperature and before source/drain implantation. These processes will be referred to generally as a "FUSI first" process.

Figure 2A:
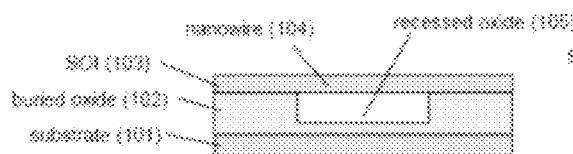
FIGS. 2A and 2B are views of a nanowire extending across a recessed oxide.
Figure 2B:
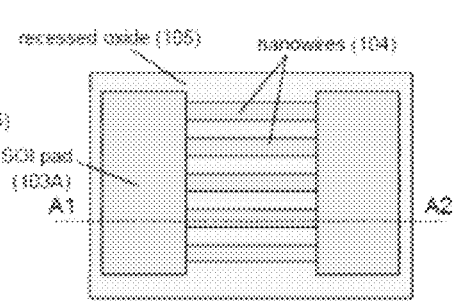

With reference to FIGS. 2A and 2B, a wafer is provided and includes a Si substrate 101, a buried oxide (BOX) layer 102 and a silicon-on-insulator (SOI) layer 103. The wafer can be fabricated using methods such as Separation by IMplanted OXygen (SIMOX) or wafer bonding (for example, Smart-Cut™). These wafer fabrication techniques are known to those of skill in the art and thus are not described further herein. Also, the substitution of other SOI substrates known in the art for the SOI on BOX configuration described herein may be made and would be within the scope of the present teachings.

Nanowires 104 connected to SOI pads 103A are patterned in SOI layer 103 to form a ladder-like structure. SOI layer 103 is made to have a typical thickness of about 20-30 nanometers (nm). As a result the as-patterned nanowires 104 have a height that is about 20-30 nm. A width of the nanowires 104 can be in the range of about 10-30 nm. The patterning of the nanowires 104 and SOI pads 103A may be achieved by lithography (e.g., optical or e-beam) followed by reactive ion etching (RIE) or by a sidewall transfer technique. These patterning techniques are known to those of skill in the art and thus are not described further herein.

The nanowires 104 can be suspended or released from the BOX layer 102 by etching and a recessing of the BOX layer 102 under the nanowires 104. The nanowires 104 thus form a suspended bridge over recessed oxide 105 between the SOI pads 103A. The recessing of the BOX layer 102 can be achieved with a diluted hydrofluoric (DHF) etch. The lateral component of this etching undercuts the BOX layer 102 under the nanowires 104. Alternatively, the suspension of the nanowires 104 may be obtained during an annealing process to re-shape the nanowires 104.

While SOI substrates provide an easy path to define and suspend nanowires 104, it is possible to obtain suspended nanowires 104 with other substrates. For example, a SiGe/Si stack epitaxially grown on bulk Si wafers can also be patterned to form the nanowires 104. The SiGe layer can be used as a sacrificial layer (analogous to the BOX layer 102) which is undercut to suspend the nanowires 104.

Figure 3A:
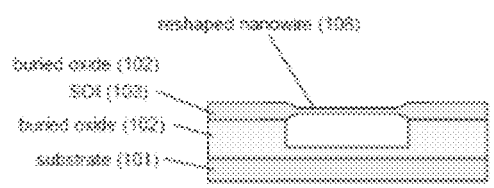
FIGS. 3A and 3B are views of a reshaped nanowire extending across the recessed oxide.
Figure 3B:
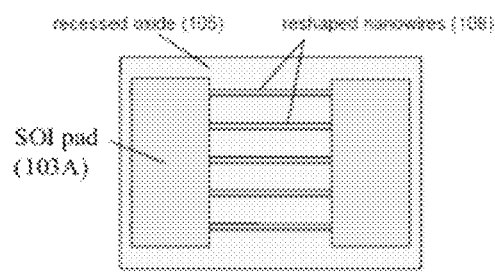

The nanowires 104 are then reshaped to form reshaped nanowires 108, as shown in FIGS. 3A and 3B. Here, the reshaping refers to a smoothing of the respective surfaces of the nanowires 104 to thereby change their respective cross-sections to be more cylindrical, and to a thinning of the respective nanowire 104 bodies by moving silicon from the nanowire 104 bodies to the SOI pads 103A. As an example, the reshaped nanowires 108 may be formed by an annealing process during which the SOI wafer contacts an inert gas at a temperature, pressure and for a duration that is sufficient to cause Si to migrate from the nanowires 104 to the SOI pads 103A. Here, the term "inert gas" refers to a gas that does not react with Si and may include hydrogen ($H_2$), xenon (Xe), helium (He) and potentially others.

Still referring to FIGS. 3A and 3B, it is seen that the wafer may be annealed in an exemplary $H_2$ gas. Shortly before $H_2$ annealing, native oxide is etched off from the surfaces of the nanowires 104 and the SOI pads 103A. The annealing in $H_2$ smoothes the nanowire sidewalls, realigns the sidewalls and the SOI pads 103A and re-shapes the nanowire 104 cross-section from a rectangular cross-section to a more cylindrical cross-section. The $H_2$ anneal may also thin the nanowire 104 body by re-distributing Si to the SOI pads 103A.

According to an exemplary embodiment, the inert gas anneal may be performed with a gas pressure of from about 30 torr to about 1000 torr, at a temperature of from about 600 degrees Celsius (° C.) to about 1100° C. and for a duration of about 1-120 minutes. In general, the rate of Si re-distribution increases with temperature and decrease with an increase in pressure.

Figure 4A:
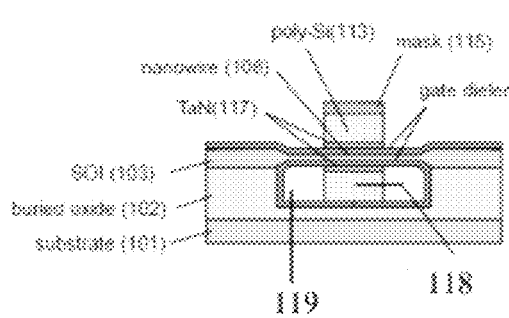
FIGS. 4A and 4B are views of a nanowire and a poly-Si coated with a gate dielectric and partially coated with TaN.
Figure 4B:
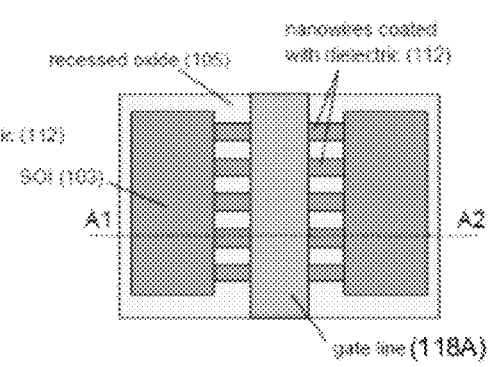
Figure 4C:
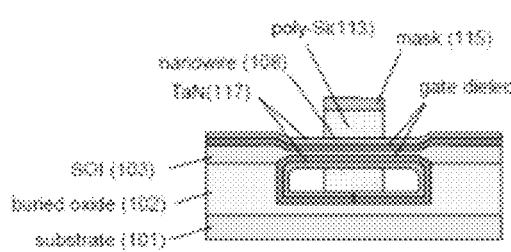
FIGS. 4C and 4D are views of the nanowire and the poly-Si fully coated with the gate dielectric and the TaN.
Figure 4D:
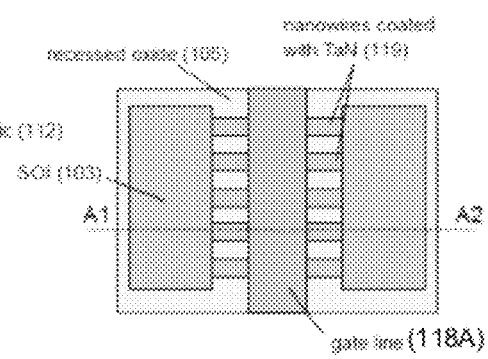

With reference to FIGS. 4A-4D, a conformal gate dielectric 112 is deposited over the structure. The gate dielectric 112 may include silicon dioxide ($SiO_2$), silicon oxynitride (SiON), hafnium oxide ($HfO_2$) or any other suitable hi-K dielectric(s) and may be deposited over SOI pads 103A and around the reshaped nanowires 108 using chemical vapor deposition (CVD), atomic layer deposition (ALD) or an oxidation furnace in the case of $SiO_2$ and SiON. A conformal deposition of a thin gate conductor 117 of, e.g., TaN or TiN, is then conducted and followed by a deposition of poly-Si 113 to form a gate stack 118 perimetrically surrounding the reshaped nanowire 108. A mask 115 is employed to facilitate the etching of a gate line by reactive ion etching (RIE). The thin gate conductor 117 may be removed by RIE as shown in FIGS. 4A and 4B. Alternatively, the removal of the thin gate conductor 117 from surfaces outside gate line 118A may require an additional wet etch step as shown in FIGS. 4C and 4D.

As an example, to fabricate a poly-Si gate, a poly-Si 113 is blanket deposited. Using lithography and selective RIE (e.g., hydrogen bromide (HBr)-based chemistry) the poly-Si 113 is selectively etched except where the etching is blocked by mask 115 to define a cleared region 119. The RIE process includes a first phase, during which etching is directional to obtain a substantially straight profile for the gate line 118A, and a second phase, during which the gate line 118A is trimmed sideways by an amount sufficient to clear the gate material under the reshaped nanowires 108 in the regions outside the gate stack 118. The gate etching can include the etching of the thin gate conductor 117, as shown in FIGS. 4A and 4B, or it can be limited to an etching of the poly-Si 113 while leaving the thin gate conductor 117 relatively intact, as illustrated in FIGS. 4C and 4D.

Poly-germanium or another suitable composition can be used as a substitute to poly-Si 113 and, in this case, the poly-germanium can later be reacted with a germanide forming metal such as nickel. Additionally, any poly-SiGe alloy can also be used to substitute poly-Si 113. Still further, poly-Si 113 can be deposited in a poly-crystalline form or deposited in an amorphous form which is later transformed into poly-Si when exposed to high temperature.

Figure 5:
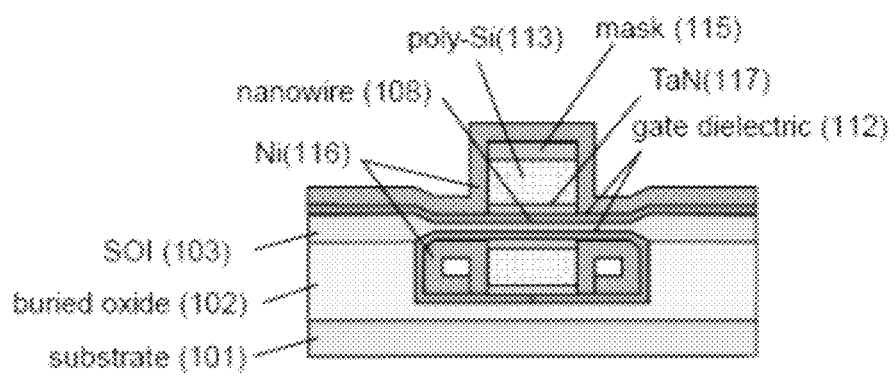
FIG. 5 is a side sectional view of a metallic coating.
Figure 6:
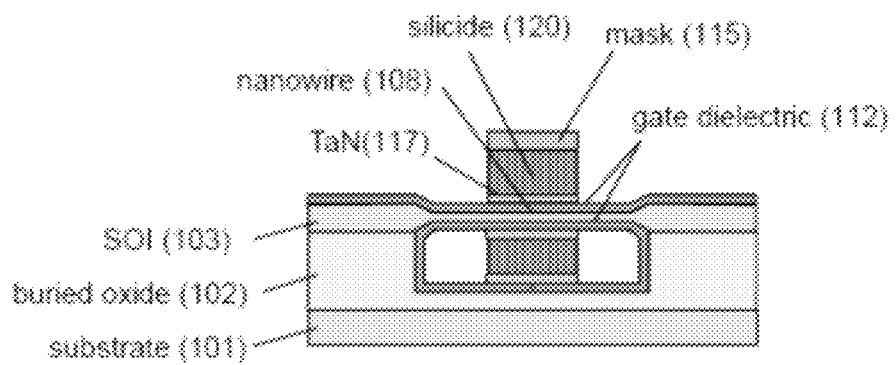
FIG. 6 is a side sectional view of a FUSI stressor.

With reference to FIGS. 5 and 6, a metal 116, such as nickel (Ni), platinum (Pt), cobalt (Co), tungsten (W) and/or titanium (Ti), for use in silicide formation is then blanket deposited over the device. The metal 116 covers horizontal surfaces and inner and outer sidewalls of the poly-Si 113. The metal 116 is annealed and, once annealed, reacts with the poly-Si 113 to form a silicide 120, as shown in FIG. 6. In the present embodiment, the "FUSI first" silicide 120 formation propagates generally sideways and, for particularly short FUSI gates, such as gates that are 50 nm or less in length, this sideways directed silicide 120 formation enables the deposition of relatively thin metal layers since the reaction takes place from both gate sidewalls. The formation of silicide 120 by sidewall reaction is, in some cases, more beneficial than the conversion of the poly-Si 113 gate to silicide by reacting the silicide forming metal 116 from the top surface of the poly-Si 113 gate downward.

The choice of silicide 120 is at least partially made to induce radial strain and, optionally, longitudinal strain in the reshaped nanowire 108 channel and is generally free of other considerations related to threshold voltage tuning since it is the thin gate conductor 117 and not the silicide 120 that sets the gate conductor work function. Additionally, since dopant incorporation for source/drain formation is carried out later in the process flow the choice of the silicide 120 to be employed is not limited by the silicide 120 formation temperature. For example, $TiSi_2$, which forms at about 750° C., can be used. Following the silicide 120 formation, unreacted metal 116 may be selectively etched with respect to the silicide 120 and the dielectric surfaces (e.g. 112, 102 and 115).

Figure 7:
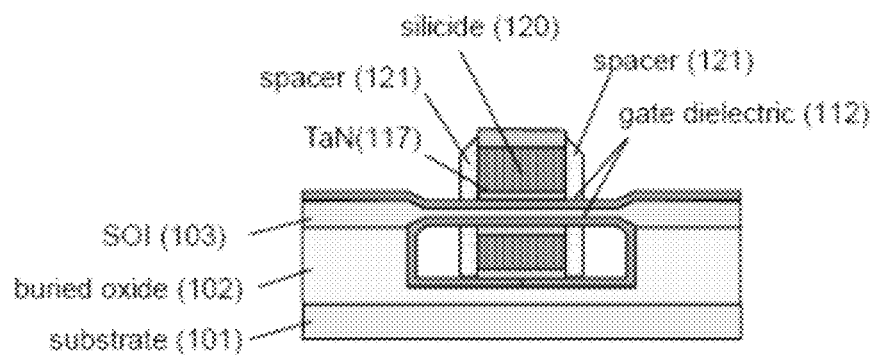
FIG. 7 is a side sectional view of the FUSI stressor of FIG. 6 with spacers.
Figure 8:
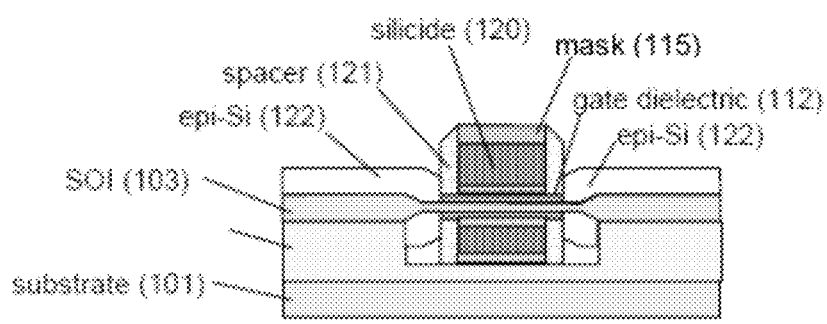
FIG. 8 is a side sectional view of the FUSI stressor of FIG. 6 with spacers and epitaxy.
Figure 9:
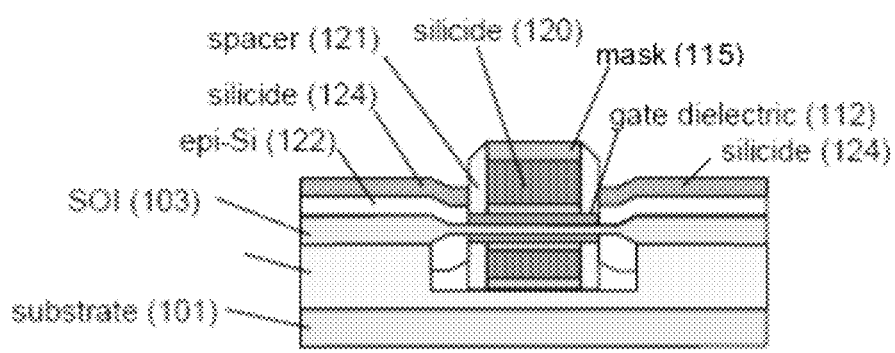
FIG. 9 is a side sectional view of the FUSI stressor of FIG. 6 with spacers and epitaxy and a silicide coating.

With reference now to FIGS. 7-9, if the exposed TaN film 117 was not removed during the gate etch as described in the embodiment of FIGS. 4C and 4D, it is now selectively etched with respect to the silicide 120 and the gate dielectric 112. Gate sidewall spacers 121 are then formed and epitaxy 122 may be selectively used to thicken the reshaped nanowire 108 portions that are not encapsulated by the gate stack 118 and sidewall spaces. The SOI pads 103A may also be thickened as necessary by epitaxy 122. Epitaxy 122 can include in-situ doping to incorporate dopants into the source/drain regions. Alternatively, ion-implantation can be used to dope the source and drain region. As shown in FIG. 9, self-aligned silicide is applied to form silicide 124 over the source and drain.

In accordance with further embodiments, the methods disclosed herein can be applied to an omega-shaped gate nanowire FET, where the nanowire 104/reshaped nanowire 108 is attached to the buried oxide 102 such that it is not suspended. In this non-suspended case, however, the strain profile may not have perfect radial symmetry. Volume expansion plays a smaller role in producing stress in the silicided films, and it is assumed that thermal mismatch between the silicide 120 and the nanowire 104/reshaped nanowire 108 is a main contributor to stress. As such, an intensity of the induced strain can be controlled and tuned by changes in the silicide formation temperature. In general, the higher the formation temperature, the higher the induced strain due to thermal mismatch.

The above embodiments describe a method and structure to induce radial strain in a nanowire FET channel. The radial strain can be decoupled from the longitudinal strain. The choice of stressor (FUSI) does not change the gate stack properties (work function).

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

What is claimed is:

1. An intermediate process device, comprising:
    a nanowire connecting first and second silicon-on-insulator (SOI) pads;
    a gate including a gate conductor surrounding an entire length of the nanowire and poly-Si surrounding the gate conductor, the entire length of the nanowire being defined as all upper, lower and side surfaces of the nanowire along the length of the nanowire; and
    silicide forming metal disposed to react with the poly-Si to form a fully silicided (FUSI) material to induce radial strain in the nanowire.

2. The device according to claim 1, wherein a material of the gate conductor is selected from the group comprising tantalum nitride (TaN) and titanium nitride (TiN).

3. The device according to claim 1, wherein the gate conductor comprises a film having a thickness of about 2-4 nm.

4. The device according to claim 1, wherein the fully silicided material comprises a silicide that forms above about 550° C.

5. The device according to claim 1, wherein the fully silicided material comprises at least one of nickel (Ni), platinum (Pt), cobalt (Co), tungsten (W) and titanium (Ti).

6. The device according to claim 1, wherein a material of the gate conductor is determinative of a work function of the gate conductor independent of the fully silicided material.

7. An intermediate process device, comprising:
    first and second pads;
    a nanowire, formed in a silicon-on-insulator (SOI) layer disposed over a buried oxide (BOX) layer, connecting the first and second pads;
    a gate surrounding an entire length of the nanowire and including a dielectric adjacent the nanowire, a gate conductor adjacent the dielectric and poly-Si surrounding the gate conductor, the entire length of the nanowire being defined as all upper, lower and side surfaces of the nanowire along the length of the nanowire; and
    silicide forming metal disposed at least along sidewalls of the poly-Si to react with the poly-Si to form a fully silicided (FUSI) material to induce radial strain on the nanowire.

8. The device according to claim 7, wherein the nanowire is substantially cylindrical.

9. The device according to claim 7, wherein the gate perimetrically surrounds the nanowire.

10. The device according to claim 7, wherein a material of the dielectric is selected from the group comprising silicon dioxide ($SiO_2$), silicon oxynitride (SiON) and hafnium oxide ($HfO_2$).

11. The device according to claim 7, wherein a material of the gate conductor is selected from the group comprising tantalum nitride (TaN) and titanium nitride (TiN).

12. The device according to claim 7, wherein the gate conductor comprises a film having a thickness of about 2-4 nm.

13. The device according to claim 7, wherein the fully silicided material comprises a silicide that forms above about 550° C.

14. The device according to claim 7, wherein the fully silicided material comprises at least one of nickel (Ni), platinum (Pt), cobalt (Co), tungsten (W) and titanium (Ti).

15. The device according to claim 7, wherein a material of the gate conductor is determinative of a work function of the gate conductor independent of the fully silicided material.

16. A device, comprising:
- a nanowire connecting first and second silicon-on-insulator (SOI) pads;
- a gate conductor surrounding an entire length of the nanowire, the entire length of the nanowire being defined as all upper, lower and side surfaces of the nanowire along the length of the nanowire;
- poly-Si surrounding the gate conductor; and
- silicide forming metal disposable for reaction with the poly-Si to thereby form a fully silicided (FUSI) material disposable to induce radial strain in the nanowire.

17. The device according to claim 16, wherein a material of the gate conductor is selected from the group comprising tantalum nitride (TaN) and titanium nitride (TiN).

18. The device according to claim 16, wherein the gate conductor comprises a film having a thickness of about 2-4 nm.

19. The device according to claim 16, wherein the fully silicided material comprises a silicide that forms above about 550° C.

20. The device according to claim 16, wherein the fully silicided material comprises at least one of nickel (Ni), platinum (Pt), cobalt (Co), tungsten (W) and titanium (Ti).

* * * * *